(12) United States Patent
Hyun et al.

(10) Patent No.: US 9,395,063 B2
(45) Date of Patent: Jul. 19, 2016

(54) LED LIGHTING ENGINE ADOPTING AN ICICLE TYPE DIFFUSION UNIT

(76) Inventors: Dong Hoon Hyun, Siheung-si (KR); Myeung Jae Noh, Uiwang-si (KR)

( * ) Notice: Subject to any disclaimer, the term of this patent is extended or adjusted under 35 U.S.C. 154(b) by 132 days.

(21) Appl. No.: 14/344,695

(22) PCT Filed: Sep. 11, 2012

(86) PCT No.: PCT/KR2012/007290
§ 371 (c)(1),
(2), (4) Date: Mar. 13, 2014

(87) PCT Pub. No.: WO2013/039317
PCT Pub. Date: Mar. 21, 2013

(65) Prior Publication Data
US 2015/0023021 A1    Jan. 22, 2015

(30) Foreign Application Priority Data
Sep. 15, 2011    (KR) .......................... 10-2011-0092827

(51) Int. Cl.
*F21V 5/04*    (2006.01)
*F21V 3/02*    (2006.01)
(Continued)

(52) U.S. Cl.
CPC ... *F21V 5/04* (2013.01); *F21K 9/50* (2013.01); *F21V 3/02* (2013.01); *F21V 7/0091* (2013.01); *F21V 17/02* (2013.01); *F21V 29/22* (2013.01); *G02B 19/0028* (2013.01); *G02B 19/0061* (2013.01); *H01L 33/50* (2013.01);
(Continued)

(58) Field of Classification Search
CPC ................................. F21V 5/04; F21V 29/004
USPC .............. 362/249.02, 311.02, 309, 310, 294
See application file for complete search history.

(56) References Cited

U.S. PATENT DOCUMENTS 8,215,802 B2 *    7/2012    Bailey ...................... 362/311.02
8,220,975 B2 *    7/2012    Miyashita et al. ............ 362/340
(Continued)

FOREIGN PATENT DOCUMENTS

JP    2007266445    10/2007
JP    2010040558    2/2010
(Continued)

OTHER PUBLICATIONS

International Search Report—PCT/KR2012/007290 dated Mar. 8, 2013.

*Primary Examiner* — Peggy Neils
(74) *Attorney, Agent, or Firm* — Cantor Colburn LLP

(57) ABSTRACT

An LED lighting source having a surface light source characteristic and an icicle type diffusion unit corresponding to the surface light source are integrally formed through coupling therebetween to provide a shield type structure having waterproof and dustproof functions. Also, the LED lighting engine may improve lighting efficiency and reduce manufacturing costs when compared to an existing lighting device, and may also be applied in various ways. Also, the LED lighting engine may satisfy quality and pricing standards for LED lighting which are the main variables visible to the eyes of a user. In addition, the LED lighting engine may be simply replaced with conventional LED lighting in a one-on-one ratio (size) which greatly influences market competitiveness. Also, the LED lighting engine may be simply and freely adjusted in terms of light uniformity and light diffusion angle.

4 Claims, 13 Drawing Sheets
(13 of 13 Drawing Sheet(s) Filed in Color)

(51) Int. Cl.
  *G02B 19/00* (2006.01)
  *F21K 99/00* (2016.01)
  *F21V 7/00* (2006.01)
  *F21V 17/02* (2006.01)
  *F21V 29/00* (2015.01)
  *H01L 33/50* (2010.01)
  *F21Y 101/02* (2006.01)
  *H01L 33/58* (2010.01)
  *F21V 3/04* (2006.01)
  *F21W 121/00* (2006.01)
  *F21Y 105/00* (2016.01)
  *H01L 51/52* (2006.01)

(52) U.S. Cl.
  CPC ........ *F21V 3/0436* (2013.01); *F21W 2121/006* (2013.01); *F21Y 2101/02* (2013.01); *F21Y 2105/008* (2013.01); *H01L 33/58* (2013.01); *H01L 51/5268* (2013.01); *H01L 2224/48091* (2013.01); *H01L 2224/8592* (2013.01); *H01L 2251/5361* (2013.01); *H01L 2933/0058* (2013.01)

(56) References Cited

U.S. PATENT DOCUMENTS

| | | | |
|---|---|---|---|
| 8,998,458 B2 * | 4/2015 | Tankala et al. | 362/373 |
| 2008/0198604 A1 | 8/2008 | Kim et al. | |
| 2011/0128731 A1 * | 6/2011 | Lin et al. | 362/235 |
| 2011/0128745 A1 * | 6/2011 | Chen et al. | 362/311.02 |

FOREIGN PATENT DOCUMENTS

| | | |
|---|---|---|
| JP | 2011044315 | 3/2011 |
| KR | 1020110072376 | 6/2011 |
| KR | 101053951 | 7/2011 |

* cited by examiner (a)

(b)

(a) Big Chip (b) Flip Chip (c) Vertical Chip (a) Nichia (b) Bridgelux (c) Cree (d) Citizen (e) Light Ocean

LED LIGHTING ENGINE ADOPTING AN ICICLE TYPE DIFFUSION UNIT

TECHNICAL FIELD

The present invention relates to a lighting engine having a Light Emitting Diode (LED) adopted thereto, and more particularly to an LED lighting engine adopting an icicle type diffusion unit, in which a specific LED light emitting body with a characteristic of a surface light source is adopted as a basic element in order to improve a light uniformity and efficiency per unit area, and which is capable of performing a double light diffusion treatment using total internal reflection and refraction, improving a glare phenomenon and removing a light pollution by entirely and identically adjusting a brightness of a light emitted surface for divergent light of the LED light emitting body, removing an occurrence of a pattern caused by a light emitting body, and efficiently controlling the light.

BACKGROUND ART

Recently, use of an LED light emitting body as a light source has been increased throughout many industries including a lighting device industry. Thus, researches for effectively and efficiently using the LED light emitting body have been actively progressed in every industrial field.

Especially, researches for an LED lighting device as a new lighting device in a concept of substituting for a conventional lighting device have become distinguished.

However, actual counterplans of related enterprises and related markets which have no basic knowledge for the conventional lighting device have failed to satisfy expectation.

With relation to a price to which a market attaches a great importance, especially, in the case in which it is desired that an LED lighting device be substituted for a conventional lighting device, since the price of the LED lighting device is at least five times to at most twenty times higher than the conventional lighting device, it is very insufficient to substitute the LED lighting device for the conventional lighting source.

In order to overcome a dilemma for such a market formation, each enterprise has made effort on growing a market by using not a price but other variables, e.g., a reduction of $CO_2$, increasing reliability, and the like. However, a market and a user are actually indifferent to the LED lighting device and expect that the price of the LED lighting device will be lowered.

Although it is clear that some newer enterprises have made efforts to lower the price of the LED lighting device, quality of the lighting source is deteriorated and a new side effect named 'light pollution' is caused as the price of the LED lighting device is lowered. The LED lighting device is frowned on by local residents and local governments who are real users.

Further, in the case that the LED lighting device is conventionally applied as scenery lighting, the scenery lighting can be viewed only in front of the LED lighting device because of the linearity of light emitted from the LED lighting device, but an image such as an advertisement cannot be seen at a side of the scenery lighting at all because it is dark. This is caused by a narrow view aperture angle due to the linearity of the light emitted from the LED lighting device. Accordingly, there is a problem in that it is difficult to control light, and there is inconvenience caused by glare and light pollution.

In addition, in the case that the conventional LED lighting device is applied as a backlight to a television and the like, in which an edge emission is applied to a television with a size smaller than 52 inches and a direct emission is applied to a television with a size larger than 60 inches, there are problems in that the price of the backlight increases and also quality of the lighting in the backlight is deteriorated.

That is, a matter of primary concern in the market is to solve the above-mentioned contradiction, and a first solution is to originate a progressive idea to satisfy the user and the manufacturer in order to solve the contradiction.

DISCLOSURE OF THE INVENTION

Technical Problems

The present invention has been made to solve the above-mentioned problem and contradiction, and an aspect of the present invention is to provide to a Light Emitting Diode (LED) lighting engine adopting an icicle type diffusion unit, in which a specific LED light emitting body with a characteristic of a surface light source is adopted as a basic element in order to improve a light uniformity and efficiency per unit area, and which is capable of performing a double light diffusion treatment using total internal reflection and refraction, improving a glare phenomenon and removing light pollution by entirely and identically adjusting a brightness of a light emitted surface for divergent light of the LED light emitting body, removing an occurrence of a pattern caused by a light emitting body, and efficiently controlling the light.

Further, another aspect of the present invention is to provide an LED lighting engine adopting an icicle type diffusion unit, in which an LED lighting source and an icicle type diffusion unit are integrally coupled and which has a sealed type structure with a waterproof function and a dustproof function.

Furthermore, still another aspect of the present invention is to provide an LED lighting engine adopting an icicle type diffusion unit, which is capable of improving brightness of a side portion as well as a front portion thereof so as to make a view aperture angle wider, and can be applied as a direct emission type backlight for a large area so as to improve lighting efficiency and to reduce a cost compared to a conventional lighting.

In addition, still another aspect of the present invention is to provide an LED lighting engine adopting an icicle type diffusion unit, which can satisfy quality and price thereof which are the largest variables in view of a user, and can reduce a manufacturing cost thereof in view of a manufacturer while the LED lighting is substituted for a lighting source of a conventional lighting with various market influence powers at a ratio of one to one, and in which a light uniformity and a light diffusion angle can be simply and freely adjusted.

Means to Solve the Problem

In accordance with an aspect of the present invention, an LED lighting engine adopting an icicle type diffusion unit is provided. The LED lighting engine includes: a substrate configured to be a chip on board (COB) and constituted of a metal printed circuit board (PCB) made of an aluminum material or a thermal conductive PCB made of a thermal conductive plastic, in which a groove is formed by an etching process, a protruding mounting portion is formed at a center portion of the groove, and a coupling groove is formed at an edge of the groove; an LED light emitting body mounted on the mounting portion of the substrate and constituted of a single LED chip or an OLED with a characteristic of a surface light source; a fluorescent substance covered on the LED light emitting body so as to induce a conversion of a wavelength of a divergent light; and an icicle diffusion unit for simultaneously inducing an internal reflection and refraction for a divergent light of the LED light emitting body so as to enhance a characteristic of a surface light source of the LED light emitting body and to evenly diffuse the light, the icicle diffusion unit being a lens structure formed to have a size corresponding to the groove and seated in the groove of the substrate and integrally bonded to the substrate.

In accordance with another aspect of the present invention, an LED lighting engine adopting an icicle type diffusion unit is provided. The LED lighting engine includes: an LED light emitting body constituted of a plurality of multichip array modules or organic light emitting diodes (OLEDs) arranged on one chip on board (COB) and having a surface light source characteristic; a heat sink prepared for a heat radiation of the LED light emitting body with the surface light source characteristic and constituted of a metal heat radiator made of an aluminum material or a ceramic heat radiator made of a graphite or a carbon nano-fiber; a thermal grease or a thermal tape joining the LED light emitting body to the heat sink and providing a heat transfer effect for the heat radiation; and an icicle type diffusion unit for simultaneously inducing internal reflection and refraction for a divergent light of the LED light emitting body so as to enhance the characteristic of the surface light source of the LED light emitting body and to evenly diffuse the light, the icicle type diffusion unit being a lens structure joined and fixed to the heat sink and seated to cover the LED light emitting body.

Preferably, the LED light emitting body satisfies $$A = \sum_{i=1}^{n} a_i \simeq na_i$$

in order to control a phase of light very stably. In the equation, A denotes an energy distribution function over the entire area of light source, i denotes the number of LED chips, n denotes the total number of LEC chips in the light source, and $a_i$ denotes an energy distribution function for $i^{th}$ LED chip.

Advantageous Effects

According to the present invention, it is possible to improve a light uniformity and light control efficiency per unit area and to enhance the characteristic of the surface light source so as to further expand a diffusion angle, and the brightness of the light emitting surface for the divergent light of the LED light emitting body is entirely and identically adjusted so as to improve a glare phenomenon, to remove light pollution, and to remove a pattern which may be generated by a pattern of the LED light emitting body.

According to the present invention, the LED lighting source with the characteristic of the surface light source is integrally coupled with the icicle type diffusion unit so as to provide a sealed structure with a waterproof function and a dustproof function. Accordingly, there are advantages in that lighting efficiency can be improved compared with the conventional lighting, and a cost can be reduced, and that the LED light source can be applied to various fields.

The present invention can satisfy quality and price of the LED lighting which are the largest variables considered by a user, and can reduce a manufacturing cost considered by a manufacturer. Further, the conventional light source with various market influence powers can be substituted with the LED lighting at a ratio of one to one. Furthermore, the light uniformity and the light diffusion angle can be simply and freely adjusted.

BRIEF DESCRIPTION OF DRAWINGS

The patent or application file contains at least one drawing executed in color. Copies of this patent or patent application publication with color drawing(s) will be provided by the Office upon request and payment of the necessary fee.

DESCRIPTION OF REFERENCE NUMERALS

Figure 1:
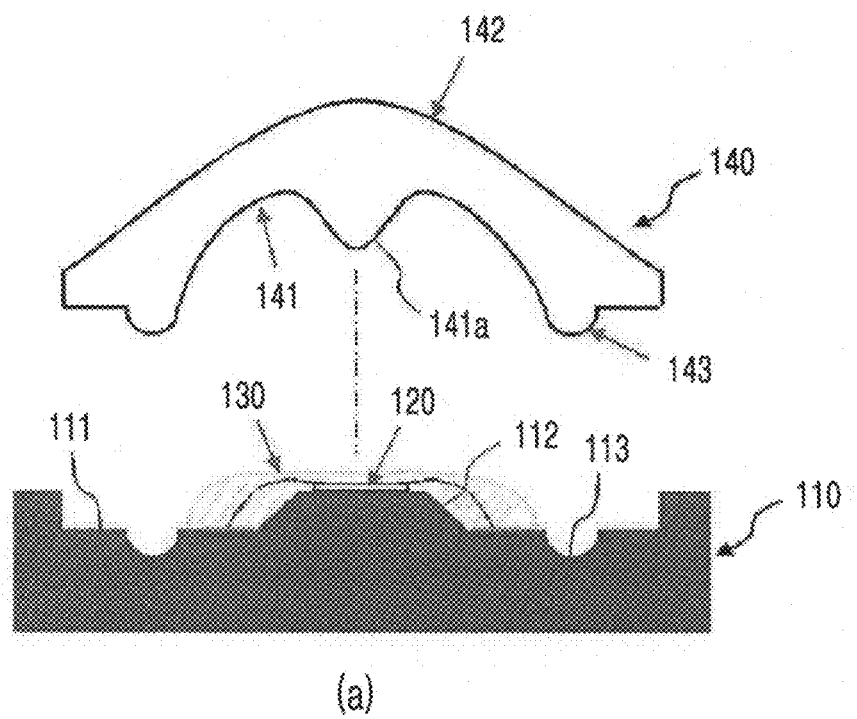
FIG. 1 is a sectional view illustrating an LED lighting engine adopting an icicle type diffusion unit according to an embodiment of the present invention.
Figure 1:
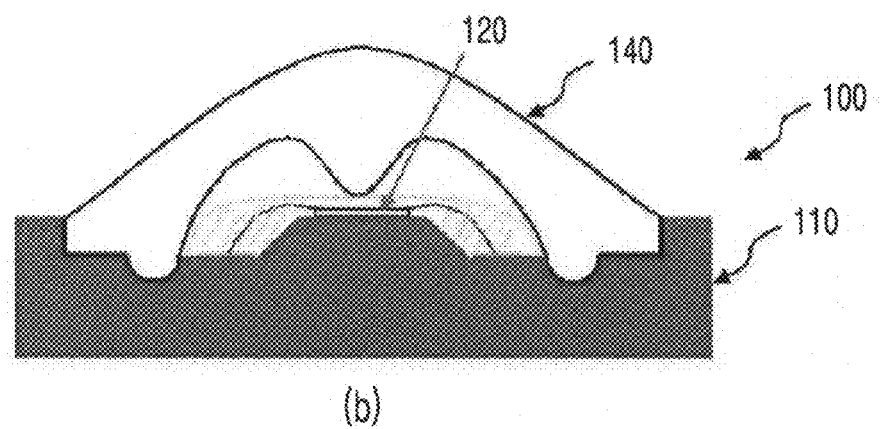

100: LED lighting engine
110: substrate
111: groove
112: mounting portion
113: coupling groove
120: LED light emitting body
130: fluorescent substance
140: icicle type diffusion unit
141: icicle aspheric inner surface
141a: light adjustment protrusion
142: outer surface
143: coupling protrusion
200: LED lighting engine
210: LED light emitting body
220: heat sink
230: thermal grease
240: icicle type diffusion unit
241: icicle aspheric inner surface
241a: light adjustment protrusion
242: outer surface
243: coupling portion

BEST MODE FOR CARRYING OUT THE INVENTION

Hereinafter, preferred embodiments of the present invention will be described in detail with reference to the accompanying drawings, and the aspects, configurations and features of the present invention will be more appreciated through the following description.

Figure 2:
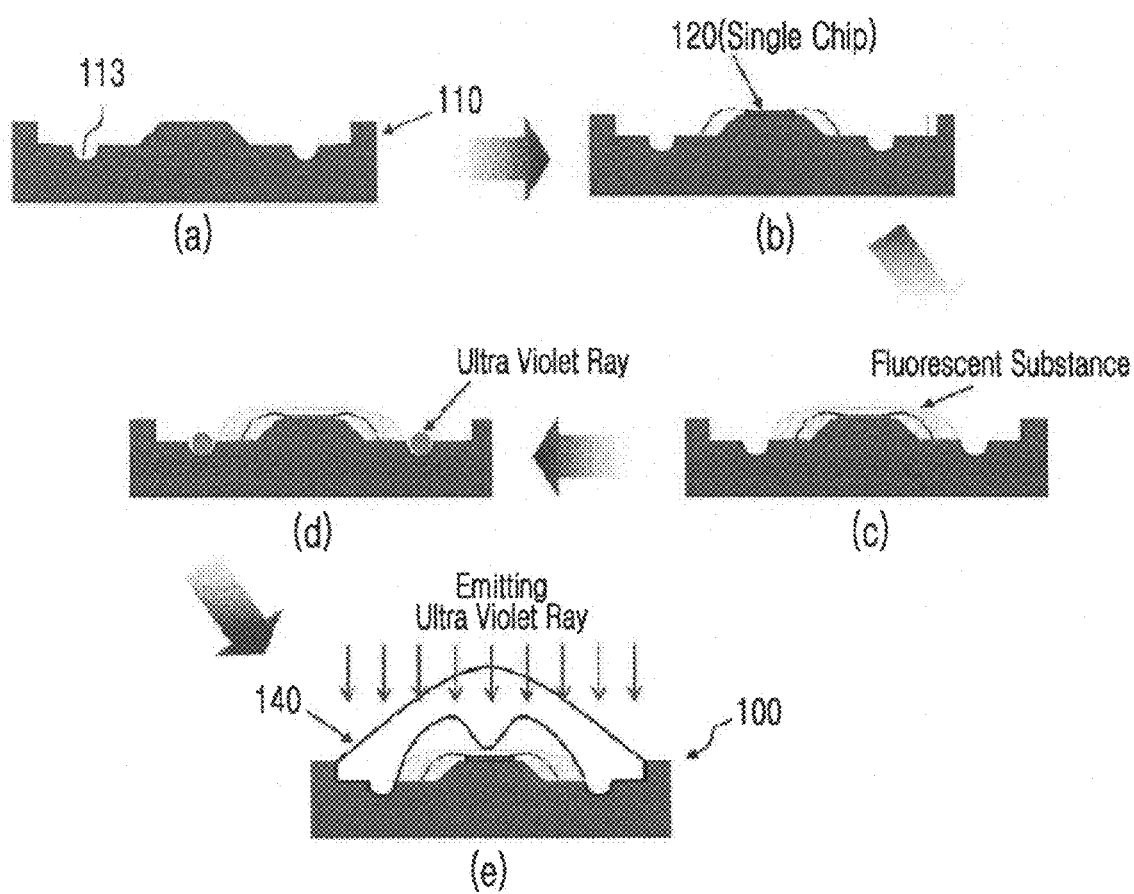
FIG. 2 is a view illustrating a process of manufacturing the LED lighting engine adopting the icicle type diffusion unit according to the embodiment of the present invention.

As shown in FIGS. 1 and 2, an LED lighting engine 100 adopting an icicle type diffusion unit according to an embodiment of the present invention includes a substrate 110, an LED light emitting body 120, a fluorescent substance 130, and the icicle type diffusion unit 140.

The substrate 110 is a chip on board (COB) on which the LED light emitting body 120 is mounted and electrically connected, and which is to radiate heat of the LED light emitting body 120. The substrate 110 is preferably constituted of a printed circuit board (PCB) made from a metal such as an aluminum material and the like, or a PCB made from a thermally conductive material such as a thermally conductive plastic.

At this time, the substrate 110 has a groove 111 formed on an upper surface thereof by etching the upper surface of the substrate 110 through at least one etching manner selected from an etching, a laser processing, a numerical control (NC) processing, and a computer numerical control (CNC) processing, in which an icicle type diffusion unit 140 is seated in and integrally combined with the substrate 110 in the form of a mutual coupling type.

A mounting portion 112 is formed at a center portion in the groove 111 in order to mount the LED light emitting body 120 thereon, which is preferably provided in a protruding form on the groove so that an end of a light adjusting protrusion 141a formed at a center of an inner surface of an icicle aspheric surface 141 is arranged to be close to the LED light emitting body 120.

Further, a coupling groove 113 is preferably formed at an edge of the groove 111, which is used for stably coupling the substrate 110 with the icicle type diffusion unit 140 through a bonding using an adhesive agent and forming an internal sealed structure.

The LED light emitting body 120 may be constituted of a single chip, e.g., not a general LED chip with linearity but an LED chip with a characteristic of a surface light source, or an organic light emitting diode (OLED).

At this time, the LED light emitting body 120 is preferably constituted such that a pattern which may be formed by a surface light emitting portion is removed by satisfying Equation 1 to form a homogeneous Lambertian surface.

$$A = \sum_{i=1}^{n} a_i \simeq na_i \qquad \text{Equation 1}$$

In the equation, A denotes an energy distribution function over the entire area of light source, i denotes the number of LED chips, n denotes the total number of LEC chips in the light source, and $a_i$ denotes an energy distribution function for $i^{th}$ LED chip.

Figure 4:
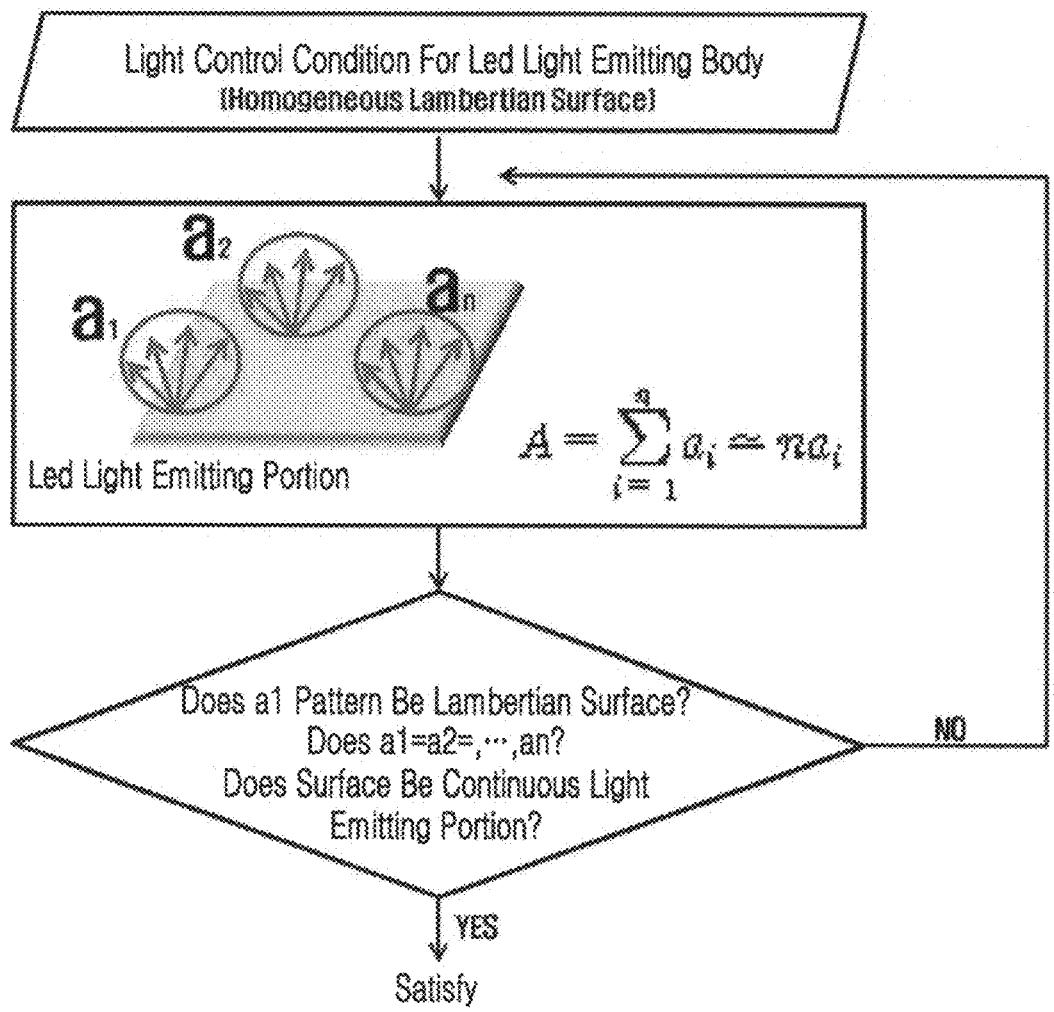
FIG. 4 is a flowchart illustrating a light control condition for removing a pattern of the LED light emitting body according to the present invention.

Referring to FIG. 4, by satisfying the question of, on any part a1, a2, . . . , an of a light emitting surface of the LED light emitting body 120, "Does a pattern form a Lambertian surface?", "Does a pattern form a homogeneous relation?", and "Does a pattern form continuous light emitting portions?", Equation 1 defines a condition for removing an influence of a light emitting pattern through the LED light emitting body 120, and is an optimal condition for controlling a light of which a phase is very stable.

Figure 3:
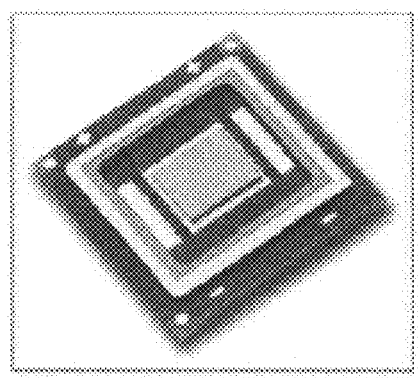
FIG. 3 is an exemplary view illustrating the LED light emitting body in the form of a single chip with a characteristic of a surface light source according to the present invention.
Figure 3:
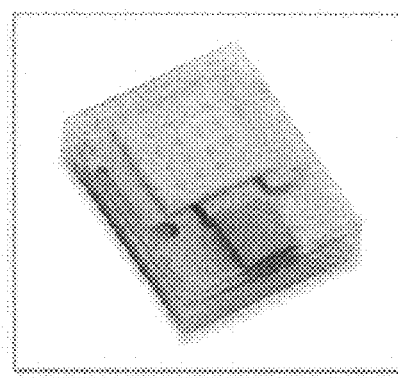
Figure 3:
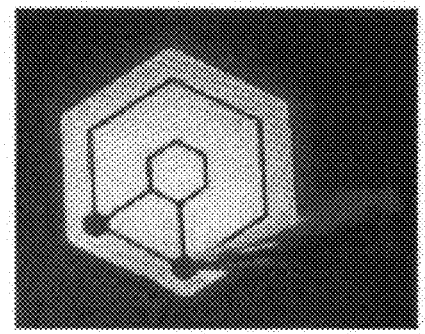

Here, any one of a big chip, a flip chip, and a vertical chip may be selected and applied as the LED chip which satisfies the condition of Equation 1 and has a characteristic of a surface light source, as shown in FIG. 3.

The fluorescent substance 130 induces a conversion of a wavelength of the light emitted from the LED light emitting body 120, and has the three primary colors, i.e., red, green and blue. The LED light emitting body 120 can be made as a white light by using the fluorescent substance 130 in such a manner that the fluorescent substance 130 is coated on the LED light emitting body 120 or a fluorescent sheet is covered on the LED light emitting body 120.

The icicle type diffusion unit 140 is a lens structure which is formed in a size corresponding to the groove 111 so as to be seated in the groove 111 of the substrate, and is disposed on the LED light emitting body 120 before it is integrally coupled with the substrate 110 by bonding so as to simultaneously reflect and refract the light emitted from the LED light emitting body 120. Further, the icicle type diffusion unit 140 expands the characteristic of the surface light source of the LED light emitting body 120 and controls the light for the even diffusion of the light.

The icicle type diffusion unit 140 is a lens structure which has a predetermined shaped body and is constituted of any one selected from a glass, a silicon, poly carbonate (PC), poly-methyl methacrylate (PMMA), and cyclo olenfin copolymer (COC).

The icicle type diffusion unit 140 includes an icicle aspheric internal surface 141 which is formed in a direction perpendicular to a direction in which the light emitted from the LED light emitting body 120 is introduced, so as to form an internal surface of a lens structure, has a curved surface with a crest and a root, has a symmetric structure in which a light adjustment protrusion 141a with an icicle shape is formed at a center portion thereof, and has an aspheric shape; an outer surface 142 which has a curved surface, i.e., spherical surface or aspheric surface, forming an outer surface of the lens structure; and a coupling protrusion 143 which protrudes from a lower surface of the lens structure.

At this time, the light adjustment protrusion 141a is formed at a center of the icicle aspheric internal surface 141 to protrude. Preferably, an end of the light adjustment protrusion 141a protrudes to be as close as possible to an upper surface of the LED light emitting body 120.

Here, the icicle aspheric internal surface 141 is a portion through which the light emitted from the LED light emitting body 120 is introduced while being a light diffusion adjusting portion functioning as an actual light diffusion unit. The icicle aspheric internal surface 141 simultaneously reflects and refracts the light emitted from the LED light emitting body 120 through the light adjustment protrusion 141a made of the same material as the icicle. Left and right portions of the LED light emitting body 120 having a concave surface except for the light adjustment protrusion 141a refract and adjust the light emitted from the LED light emitting body 120, so that the light emitted from the LED light emitting body 120 with the characteristic of the surface light source is evenly diffused so as to more greatly expand the surface light source.

Further, the outer surface 142 transmits and radiates the light of the LED light emitting body 120 which is in a state in which the light is diffused and adjusted through the icicle aspheric internal surface 141 in a front direction. The outer surface 142 may be formed of a freely curved surface such as a symmetric or asymmetric surface, and the curved shape of the outer surface can be variously modified and changed.

Hereinafter, a process of manufacturing the LED lighting engine 100 adopting the icicle type diffusion unit according to the embodiment of the present invention with the above-mentioned structure will be described with reference to FIG. 2.

A substrate 110 for the COB on which the LED light emitting body 120 is mounted and electrically connected is prepared, in which the groove 111 including the mounting portion 112 and the coupling groove 113 is formed on an upper surface of the substrate 110 through an etching process as shown in (a) of FIG. 2.

As shown in (b) of FIG. 2, the LED light emitting body 120 of the LED chip or the OLED chip with the characteristic of the surface light source is disposed and treated by a wire bonding on the mounting portion 112 of the substrate 110, so that the LED light emitting body 120 can be electrically connected with the substrate 110 to process a signal.

As shown in (c) of FIG. 2, the fluorescent substance 130 is disposed over the LED light emitting body 120 mounted on the mounting portion 112 of the substrate 110.

As shown in (d) of FIG. 2, an adhesive agent is coated within the coupling groove 113 of the substrate 110 for a bonding coupling with the icicle type diffusion unit 140.

At this time, an ultraviolet bond or a general bond may be used as the adhesive agent.

As shown in (e) of FIG. 2, the icicle type diffusion unit 140 is seated and matched on the groove 111 of the substrate 110, and is integrally coupled with the substrate 110 through a bonding coupling force.

At this time, in the case of using the ultraviolet bond, the ultraviolet bond is cured by emitting an ultraviolet ray, so that the icicle type diffusion unit 140 is integrally coupled with the substrate 110 on which the LED light emitting body 120 having the characteristic of the surface light source is mounted.

Figure 5:
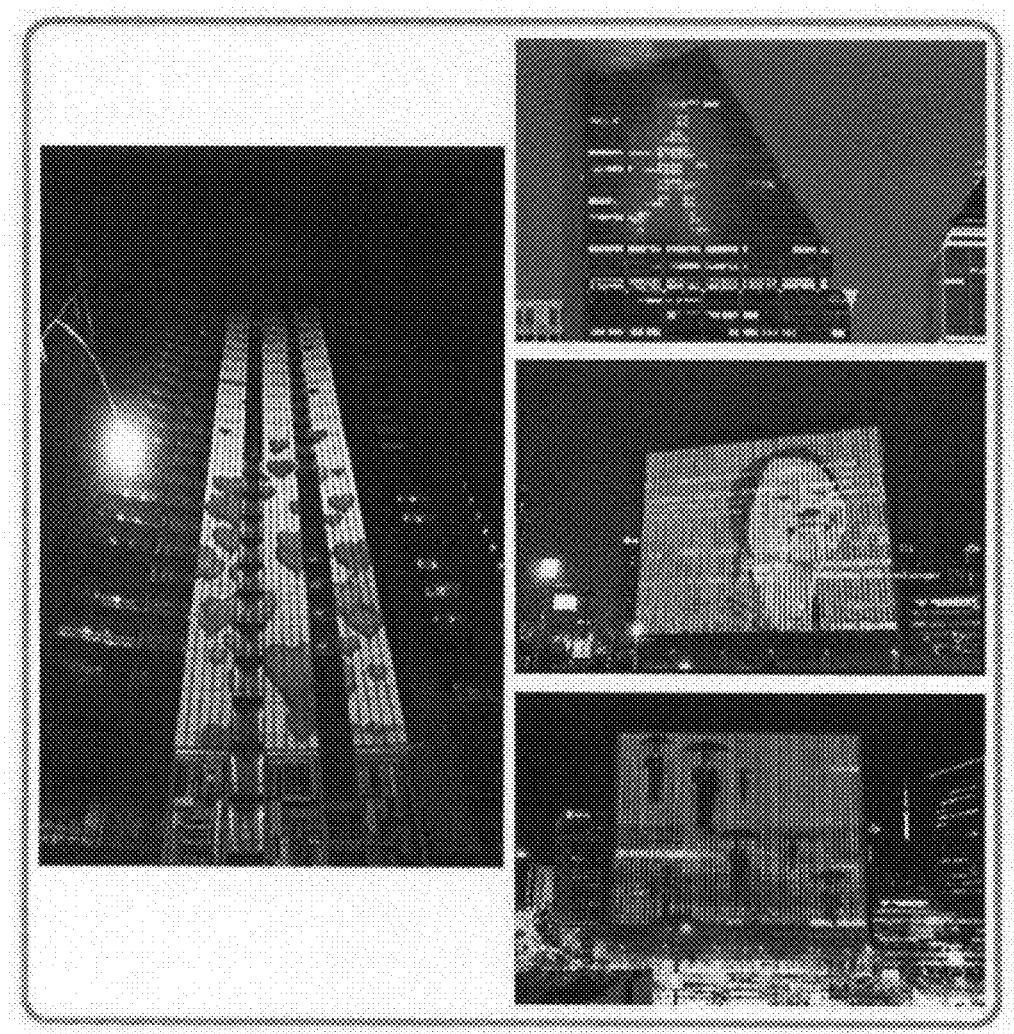
FIGS. 5 to 7 are exemplary views illustrating use of the LED lighting engine adopting the icicle type diffusion unit according to the embodiment of the present invention.

The LED lighting engine 100 adopting the icicle type diffusion unit according to the embodiment of the present invention can be applied to the scenery lighting as shown in FIG. 5, which has a characteristic of controlling a light and isolating the light pollution, and has a wider view aperture angle so that the light emitted from the LED lighting can be seen in front of and at a side of the LED lighting.

Figure 6:
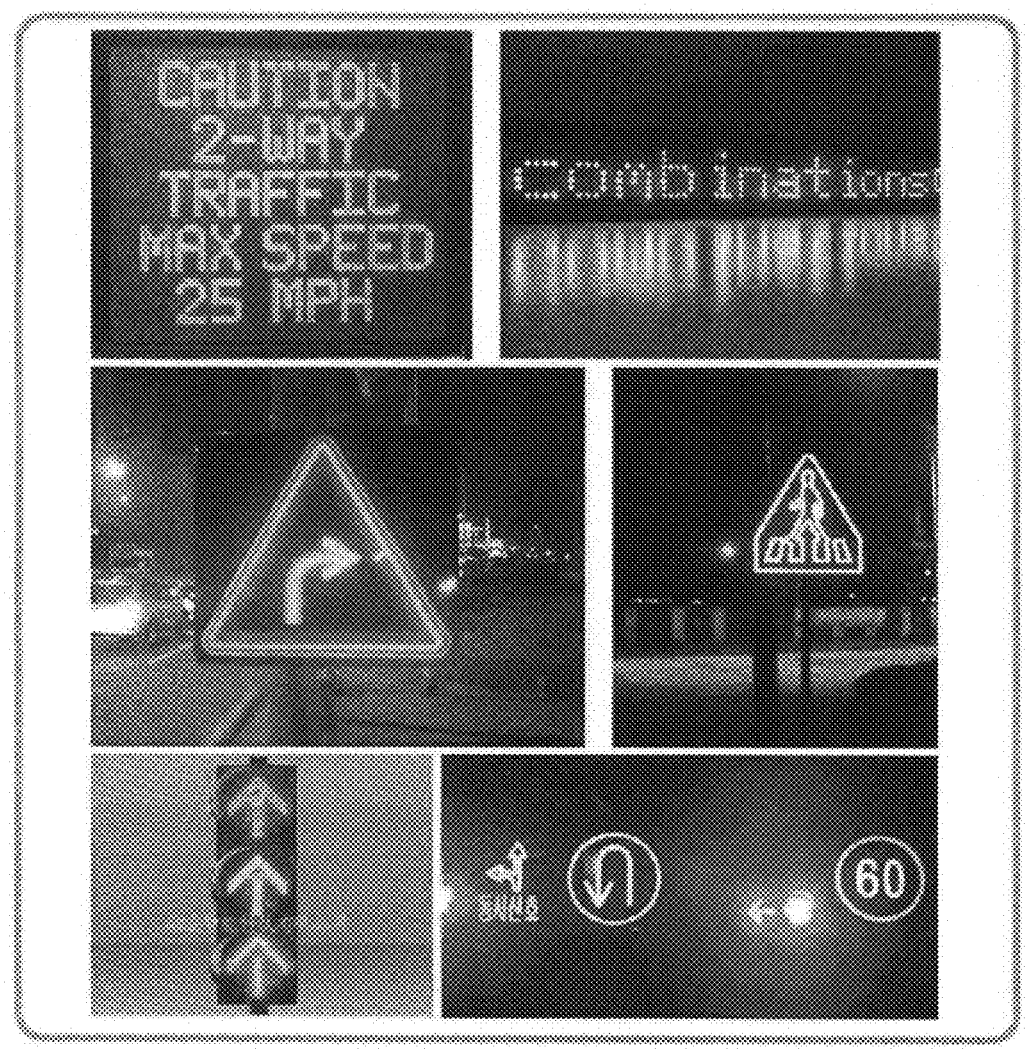

As shown in FIG. 6, further, the LED lighting engine 100 can be applied to an advertising signboard or a traffic signboard, thereby preventing a glare so as to secure a definition of the signboard.

Figure 7:
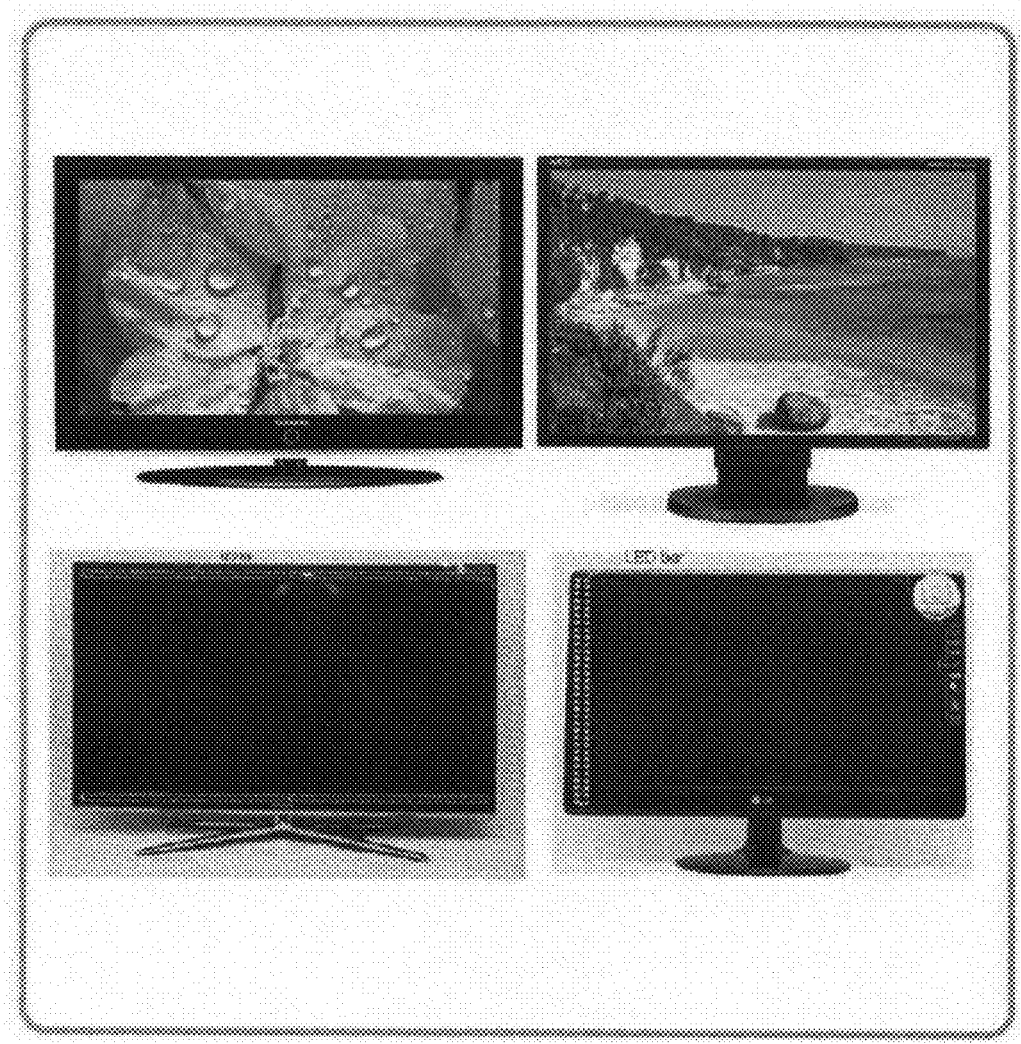

As shown in FIG. 7, furthermore, the LED lighting engine 100 can be applied to an LED television with a large size over 60 inches as a backlight in not an edge emission manner but a direct emission manner, thereby reducing a price of the LED television compared with a conventional television and improving a quality of the LED television such as the light uniformity and the prevention of the glare.

Figure 8:
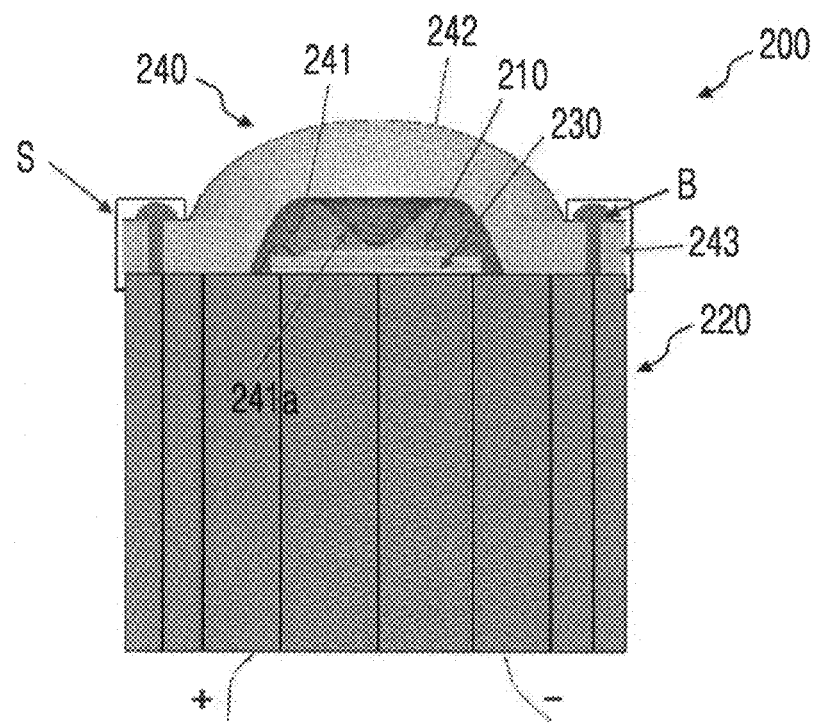
FIG. 8 is a sectional view illustrating an LED lighting engine adopting an icicle type diffusion unit according to another embodiment of the present invention.
Figure 9:
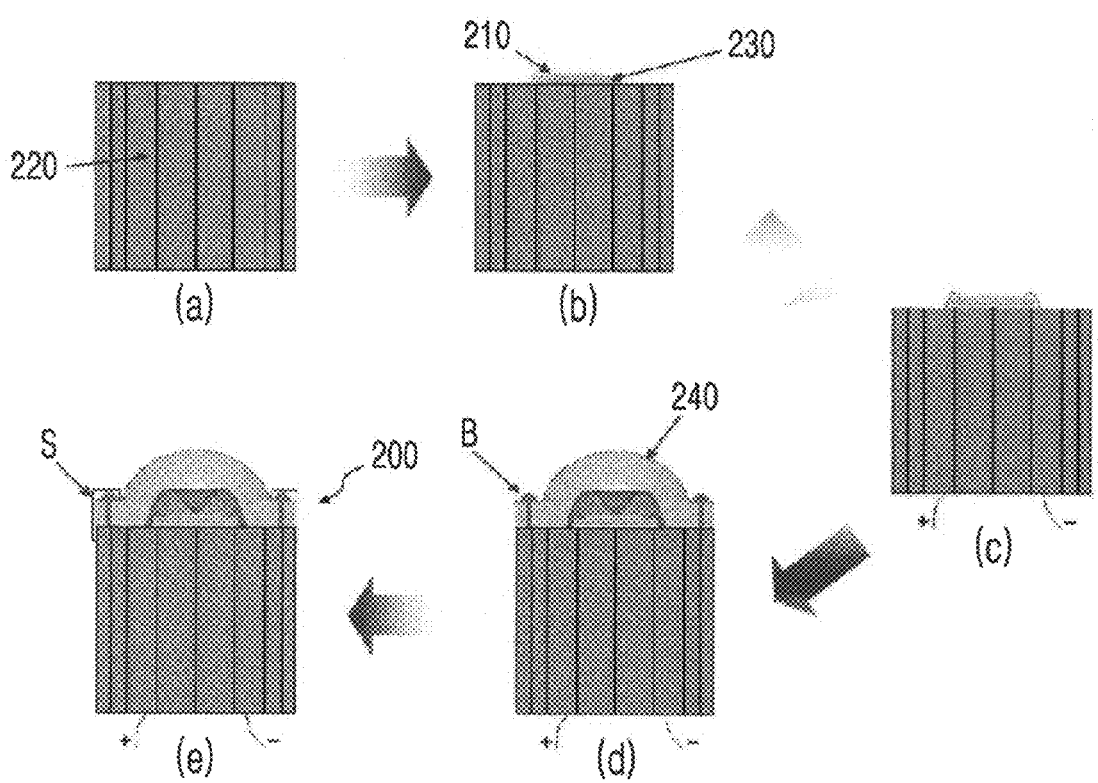
FIG. 9 is a view illustrating a process of manufacturing the LED lighting engine adopting the icicle type diffusion unit according to another embodiment of the present invention.
Figure 10:
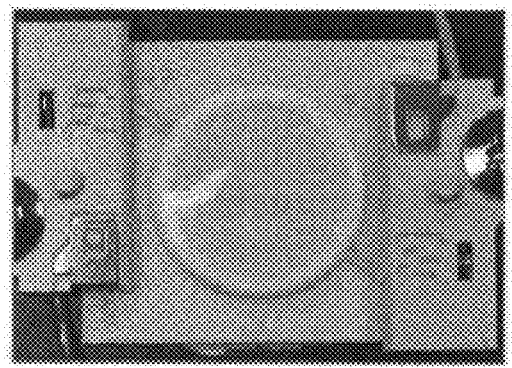
FIG. 10 is an exemplary view illustrating an LED light emitting body in the form of a multi-chip with a characteristic of a surface light source according to the present invention.
Figure 10:
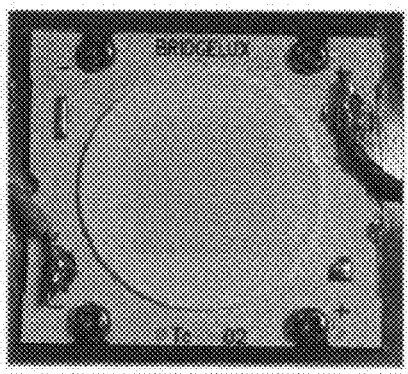
Figure 10:
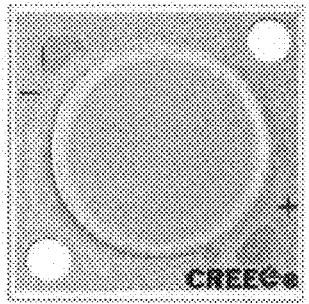
Figure 10:
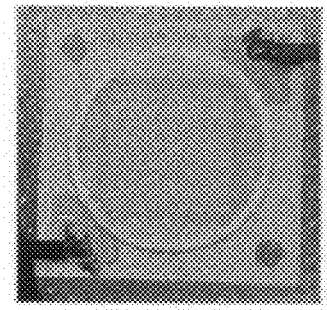
Figure 10:
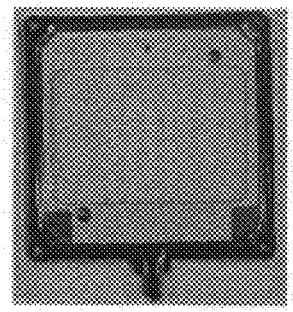

On the other hand, FIG. 8 is a sectional view illustrating an LED lighting engine adopting an icicle type diffusion unit according to another embodiment of the present invention, and FIG. 9 is a view illustrating a process of manufacturing the LED lighting engine adopting the icicle type diffusion unit according to another embodiment of the present invention. As shown in FIGS. 8 and 9, the LED lighting engine 200 adopting the icicle type diffusion unit according to another embodiment of the present invention includes an LED light emitting body 210 in the form of a multichip array module in which a plurality of LED chips or OLED chips are arranged on one COB, a heat sink 220, a thermal grease, and an icicle type diffusion unit 240 with a coupling portion.

The LED light emitting body 210 includes a substrate, and is a module in which 100~150 of the LED chips are multiple-arranged on one COB. The LED light emitting body 210 has a characteristic of the surface light source.

At this time, the LED light emitting body 210 is preferably configured to satisfy a condition of Equation 1, thereby removing a pattern which may be formed by a surface light emitting portion and stably controlling a phase of the light.

Here, any one selected from multichip array modules manufactured by Nichia Co., Bridgelux Co., Cree Co., Citizen Co., and Light Ocean Co. may be used as the LED light emitting body 210 satisfying the condition of Equation 1 and having the characteristic of the surface light source.

The heat sink 220 is prepared for radiating heat of the LED light emitting body 210 constituted of the multichip array module or the OLED, and may be configured of a metal heat radiator made of an aluminum material or a ceramic heat radiator made of graphite or carbon nano-fiber.

The thermal grease 230 is prepared for joining the LED light emitting body 210 to the heat sink 220 so as to radiate the heat of the LED light emitting body 210, and may be substituted with a thermal tape.

The icicle type diffusion unit 240 simultaneously reflects and refracts a divergent light of the LED light emitting body 210, so as to control the divergent light so that the characteristic of the surface light source of the LED light emitting body 210 is enhanced and the light emitted from the LED light emitting body 210 is evenly diffused. The icicle type diffusion unit 240 is a lens structure with a predetermined shaped body, which is made of any one selected from a glass, poly carbonate (PC), poly-methyl methacrylate (PMMA), and cyclo-olefin copolymer (COC).

The icicle type diffusion unit 240 includes an icicle aspheric internal surface 241 which is formed in a direction perpendicular to a direction in which the divergent light emitted from the LED light emitting body 210 is introduced, so as to form an internal surface of the lens structure, has a curved surface with a crest and a root, has a left and right symmetric structure in which a light adjustment protrusion 241a with an icicle shape is formed at a center portion thereof, and has an aspheric shape; an outer surface 242 which has a curved surface, i.e., spherical surface or aspheric surface, forming an outer surface of the lens structure; and a coupling protrusion 243 which extends from an edge of the lens structure.

At this time, the light adjustment protrusion 241a is formed at a center of the icicle aspheric internal surface 241 in the form of a protrusion. Preferably, an end of the light adjustment protrusion 141a protrudes to be most close to an upper surface of the LED light emitting body 210.

Since the icicle type diffusion unit 240 has an identical function as that of the icicle type diffusion unit 140 according to one embodiment, the icicle type diffusion unit 140 is applied in this embodiment and the detailed description of the icicle type diffusion unit 240 will be omitted.

Hereinafter, a process of manufacturing the LED lighting engine 200 adopting the icicle type diffusion unit according to the embodiment of the present invention with the above-mentioned structure will be described with reference to FIG. 9.

As shown in (a) of FIG. 9, the heat sink 220 is prepared. As shown in (b) of FIG. 9, the LED light emitting body 210 constituted of the multichip array module with the characteristic of the surface light source or the OLED is seated and disposed on a center of an upper surface of the heat sink 220, and is fixed and joined to the heat sink 220 by using the thermal grease 230.

As shown in (c) of FIG. 9, a wiring such as a wire bonding is performed on the LED light emitting body 210 fixed and joined to the heat sink so that an electrical connection and a signal processing can be carried out.

As shown in (d) of FIG. 9, the icicle type diffusion unit 240 is joined and fixed to the heat sink 220, to which the LED light emitting body 210 is fixed and joined, through a bolt coupling, in which the icicle aspheric inner surface of the icicle type diffusion unit 240 receives and covers the LED light emitting body 210 and the end of the light adjustment protrusion 241a is as close as possible to the upper surface of the LED light emitting body 210.

As shown in (e) of FIG. 9, silicon is coated on a joining portion of the icicle type diffusion unit 240 and the heat sink 20 so as to provide a waterproof function to the joining portion.

Figure 11:
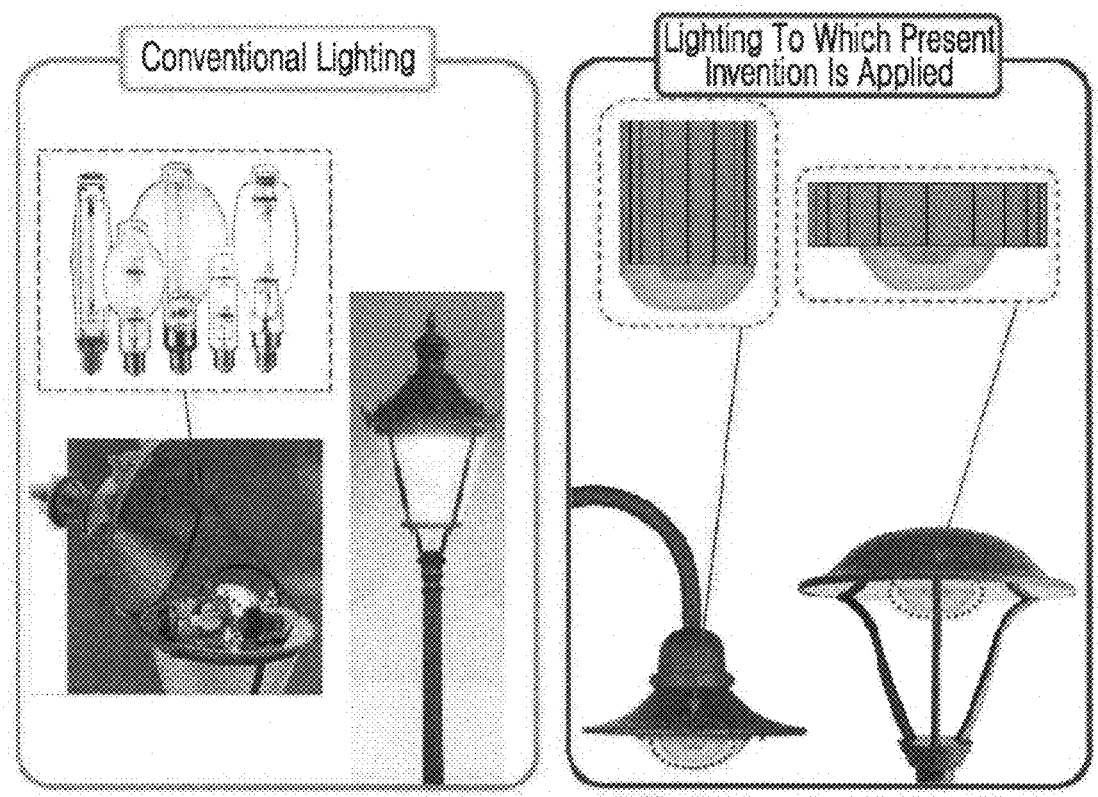
FIGS. 11 to 13 are exemplary views illustrating use of the LED lighting engine adopting the icicle type diffusion unit according to another embodiment of the present invention.

The LED lighting engine 200 adopting the icicle type diffusion unit according to the present invention may be used as lightings in a park, as shown in FIG. 11, and especially may be substituted for only conventional lightings in the park.

Figure 12:
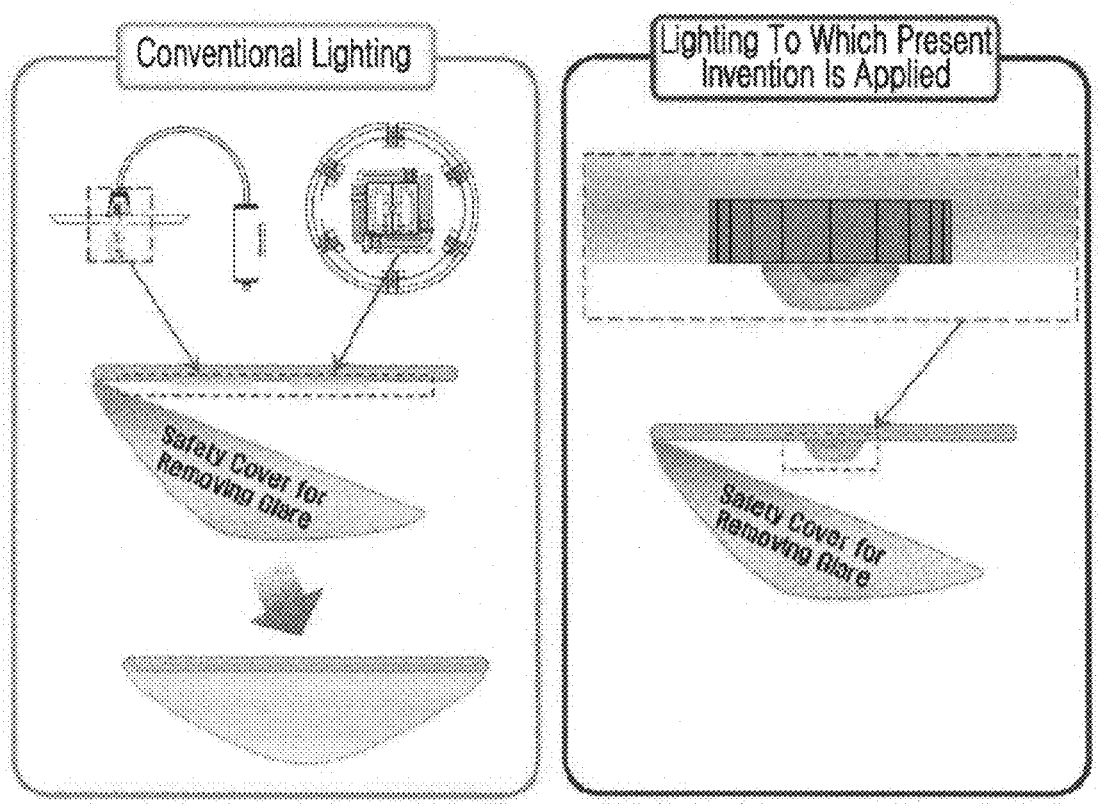

As shown in FIG. 12, further, the conventional lightings are essentially provided with a cover member for preventing glare in the case that they are used as lighting in a living room, a banquet hall, and the like. However, the LED lightings according to the present invention are substituted for the conventional lightings and also the icicle type diffusion unit 240 functions as the cover member by itself. Therefore, the LED lightings do not require a separate cover member, thereby reducing a cost.

Figure 13:
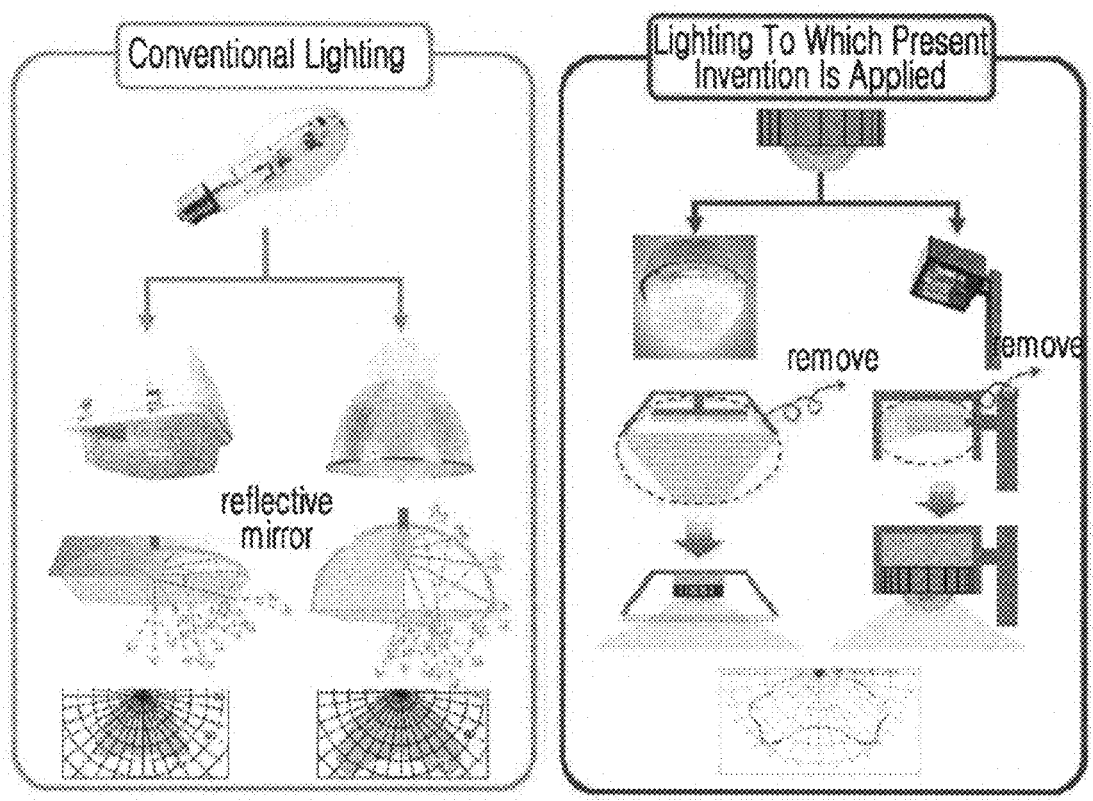

As shown in FIG. 13, furthermore, in the case that lightings are used in a gas station, a factory, a parking lot and the like, the conventional lightings are essentially provided with a reflective mirror for a control of light, while the lightings according to the present invention are substituted for the conventional lightings and the icicle type diffusion unit 240 functions as the reflective mirror. Accordingly, it is possible to reduce a cost by removing the reflective mirror and to improve an efficiency of controlling the light.

On the other hand, although only the LED lighting engines 100 and 200 adopting the icicle type diffusion unit according to the present invention have been shown, the LED lighting engine may be configured to include a switching mode power supply (SMPS) embedded in an internal space thereof, or mounted on an external space thereof.

INDUSTRIAL APPLICABILITY

The LED lighting engine of the present invention is a lighting engine including an icicle type diffusion unit with a characteristic of performing a light diffusion process using total internal reflection and refraction, which is capable of entirely and identically controlling brightness of a light emitting surface for the light emitted from the LED lighting, improving a glare phenomenon, removing light pollution, preventing an occurrence of a pattern caused by the light emitting body, and efficiently performing a control of light.

The invention claimed is:

1. An LED lighting engine adopting an icicle type diffusion unit, The LED lighting engine comprising:
   a substrate configured to be a chip on board (COB) and constituted of a metal printed circuit board (PCB) made of an aluminum material or a thermal conductive PCB made of a thermal conductive plastic, in which a groove is formed by an etching process, a protruding mounting portion is formed at a center portion of the groove, and a coupling groove is formed at an edge of the groove;
   an LED light emitting body mounted on the mounting portion of the substrate and constituted of a single LED chip or an OLED with a characteristic of a surface light source;
   a fluorescent substance covered on the LED light emitting body so as to induce a conversion of a wavelength of a divergent light; and
   an icicle diffusion unit for simultaneously inducing an internal reflection and refraction for a divergent light of the LED light emitting body so as to enhance a characteristic of a surface light source of the LED light emitting body and to evenly diffuse the light, the icicle diffusion unit being a lens structure formed to have a size corresponding to the groove and seated in the groove of the substrate and integrally bonded to the substrate,
   wherein the icicle type diffusion unit is a lens structure made of any one selected from a glass, silicon, polycarbonate, poly methyl methacrylate, and cyclo olefin copolymer, and includes an inner surface having an aspheric surface, which is formed in a direction perpendicular to a direction in which the divergent light of the LED light emitting body is introduced, so as to constitute an inner surface of the lens structure, is a curved surface with a crest and roots, and has a symmetric structure on left and right sides, and in which an icicle type light adjustment protrusion is formed at a center portion thereof, an outer surface configured to be a curved surface constituting the outer surface of the lens structure and being formed of a spherical surface or an aspheric surface, and a coupling protrusion protruding from a lower surface of the lens structure and formed to be matched on the coupling groove of the substrate.

2. The LED lighting engine as claimed in claim 1, wherein the LED light emitting body satisfies a condition of Equation so that a surface of the light emitting body forms a Lambertian pattern, a homogeneous relation, and a continuous light emitting portion at any portion in order to stably and optimally control a phase of the light:

$$A = \sum_{i=1}^{n} a_i \simeq na_i. \qquad \text{Equation}$$

wherein A denotes an energy distribution function over entire area of a light source, i denotes a number of LED chips in the light source, n denotes a total number of the LED chips in the light source, and $a_i$ denotes an energy distribution function for $i^{th}$ LED chip.

3. An LED lighting engine adopting an icicle type diffusion unit, the LED lighting engine comprising:
   an LED light emitting body constituted of a plurality of multichip array modules or organic light emitting diodes (OLEDs) arranged on one chip on board (COB) and having a surface light source characteristic;
   a heat sink prepared for a heat radiation of the LED light emitting body with the surface light source characteristic and constituted of a metal heat radiator made of an aluminum material or a ceramic heat radiator made of a graphite or a carbon nano-fiber;
   a thermal grease or a thermal tape joining the LED light emitting body to the heat sink and providing a heat transfer effect for the heat radiation; and
   an icicle type diffusion unit for simultaneously inducing internal reflection and refraction for a divergent light of the LED light emitting body so as to enhance the characteristic of the surface light source of the LED light emitting body and to evenly diffuse the light, the icicle type diffusion unit being a lens structure joined and fixed to the heat sink and seated to cover the LED light emitting body, wherein the icicle type diffusion unit is a lens structure made of any one selected from a glass, silicon, polycarbonate, poly methyl methacrylate, and cyclo olefin copolymer, and includes an inner surface having an aspheric surface, which is formed in a direction perpendicular to a direction in which the divergent light of the LED light emitting body is introduced, so as to constitute an inner surface of the lens structure, is a curved surface with a crest and roots, and has a symmetric structure on left and right sides, and in which an icicle type light adjustment protrusion is formed at a center portion thereof; an outer surface configured to be a curved surface constituting the outer surface of the lens structure and being formed of a spherical surface or an aspheric surface; and a coupling portion extending from an edge of the lens structure, and coupling and fixing the icicle type diffusion unit to the heat sink.

4. The LED lighting engine as claimed in claim 3, wherein the LED light emitting body satisfies a condition of Equation so that a surface of the light emitting body forms a Lambertian pattern, a homogeneous relation, and a continuous light emitting portion at any portion in order to stably and optimally control a phase of the light:

$$A = \sum_{i=1}^{n} a_i \simeq na_i.$$ Equation wherein A denotes an energy distribution function over entire area of a light source, i denotes a number of LED chips in the light source, n denotes a total number of the LED chips in the light source, and $a_i$ denotes an energy distribution function for $i^{th}$ LED chip.

* * * * *